United States Patent [19]

Krett

[11] Patent Number: 5,473,498
[45] Date of Patent: Dec. 5, 1995

[54] POWER AMPLIFIER OVER-VOLTAGE PROTECTION CIRCUIT

[75] Inventor: David L. Krett, Springville, Iowa

[73] Assignee: Rockwell International Corporation, Seal Beach, Calif.

[21] Appl. No.: 83,415

[22] Filed: Jun. 28, 1993

[51] Int. Cl.[6] .................................. H02H 7/20; H03F 1/52
[52] U.S. Cl. .................................................. 361/56; 361/91
[58] Field of Search .......................... 361/54, 56, 91, 361/111, 119, 88; 455/117

[56] References Cited

U.S. PATENT DOCUMENTS

| | | | |
|---|---|---|---|
| 3,600,695 | 8/1971 | Krausser | 330/11 |
| 4,178,619 | 12/1979 | Seiler et al. | 361/91 |
| 4,186,418 | 1/1980 | Seiler | 361/91 |
| 4,347,482 | 8/1982 | Ohta et al. | 330/298 |
| 4,378,586 | 3/1983 | Bete | 363/56 |
| 4,589,049 | 5/1986 | Krumrein | 361/56 |
| 4,673,886 | 6/1987 | Bickley et al. | 330/298 |
| 5,172,290 | 12/1992 | Leipold et al. | 361/56 |

Primary Examiner—Howard L. Williams
Assistant Examiner—Michael J. Sherry
Attorney, Agent, or Firm—Kyle Eppele; M. Lee Murrah; George A. Montanye

[57] ABSTRACT

An apparatus and method of accomplishing over-voltage protection for variable power levels and frequency applications including the microwave range. Clamping means are provided that instantaneously absorb over-voltage conditions for a brief period while simultaneously providing feedback control of a driver signal to reduce the source of the over-voltage condition.

1 Claim, 1 Drawing Sheet

POWER AMPLIFIER OVER-VOLTAGE PROTECTION CIRCUIT

BACKGROUND OF THE INVENTION

The invention relates to over-voltage circuitry and more specifically to transistor over-voltage circuitry.

Electrical circuitry utilized in a variety of applications is designed to satisfy certain operational characteristics such as voltage and current values. Naturally, inherent limitations exist in the associated circuitry that must be carefully adhered to in order to avoid failure. Typically, additional components that absorb excess voltage are used to protect main circuitry devices. Alternatively, a variety of cut-off devices that temporarily unload the protected circuit while excess power dissipates have also been proposed. Other variations, usually focusing upon tolling the input of absorbing the output are also known.

RF power amplifiers perform well when their outputs are properly terminated. In conditions of infinite VSWR (open or short circuited) the output transistors fail unless properly protected. Circulator devices located between the power amplifier and the RF output port insure a proper output load. Unfortunately, circulators are not practical at lower RF frequencies thus necessitating the use of push-pull amplifiers in order to provide over-voltage protection. The push-pull amplifier solution is ill-suited for applications involving multiple octaves and low power level.

Thus, there currently exists a need for improved over-voltage protection means in specialized applications.

SUMMARY OF THE INVENTION

The present invention contemplates an apparatus and method of accomplishing over-voltage protection for certain applications primarily concerned with low RF frequencies of multiple octaves at high power levels.

Clamping means are provided that instantaneously absorb over-voltage conditions for a brief period while simultaneously providing feedback control of a driver signal to reduce the source of the over-voltage condition.

One embodiment of the present invention is implemented in an RF power amplifier circuit of low wattage and low frequency, poorly suited for prior art methods of over-voltage protection. Switching means, such as a PNP transistor, is coupled to clamping means, comprised of a zener diode device, which provides short-term correction of the over-voltage condition while feedback means that may include additional switching means provides feedback control of the driver signal in an effort to prevent continued over-voltage conditions.

It is therefore an object of the present invention to provide an apparatus and method for providing over-voltage protection to various circuit applications.

It is a feature of the present invention to monitor the output and utilize clamping means for protecting the underlying circuitry.

It is yet another feature of the present invention to provide circuit driver feedback control in over-voltage situations.

It is an advantage of the present invention to provide a low cost highly efficient means of providing over-voltage protection in power amplifier devices.

These and other objects, features and advantages are disclosed and claimed in the specification, figures and claims of the present application.

DETAILED DESCRIPTION OF THE DRAWINGS

Figure 1:
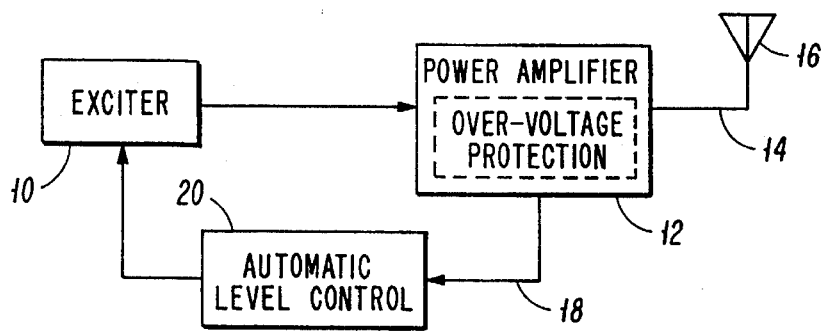
FIG. 1 is a block diagram of a transmitter system incorporating the teachings of the present invention.

Referring now to the drawings wherein like items are referenced as such throughout, FIG. 1 illustrates a block diagram of certain portions of a communication system incorporating the teachings of the present invention. An exciter 10 generates an RF input signal that is coupled to power amplifier means 12 that includes over-voltage protection means 13. The power amplifier means 12 has two outputs, a first output 14 consisting of an RF output signal coupled to antenna means 16 and a second output 18 consisting of the sensed voltage across a given resistance means. The second output 18 is coupled through automatic-level-control (ALC) means 20 and looped back into the exciter 10. The ALC means 20 reduces the RF input level to the amplifier means 12, once a predetermined threshold has been met or exceeded.

Figure 2:
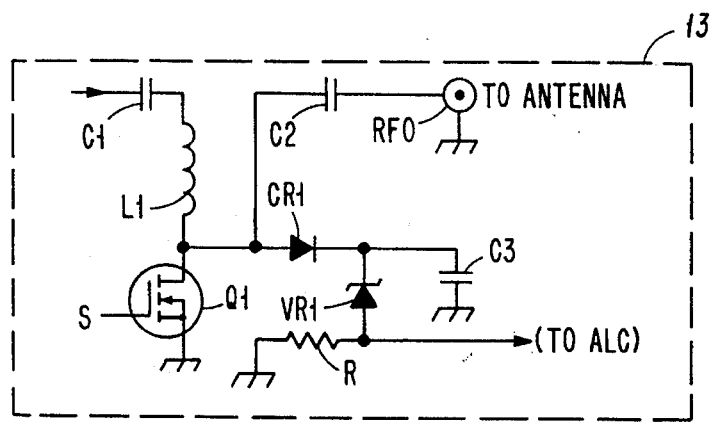
FIG. 2 is a schematic diagram of an over-voltage protection circuit incorporating the teachings of the present invention.

FIG. 2 illustrates a schematic circuit diagram of one embodiment of the over-voltage protection circuit of FIG. 1. A transistor $Q_1$, shown as an N channel enhancement MOSFET device, has its gate terminal coupled to an input signal S. It is assumed that the input waveform of signal S has a large enough amplitude to insure saturation and cutoff of transistor $Q_1$. It is also assumed that the input waveform is symmetrical and the peak drain voltage reaches a value of $2V_{dd}$ when the output is terminated. (Assumption of a symmetrical waveform is for illustration purposes only and is not a limitation of the teachings of the present invention.) An inductor device $L_1$ has a first terminal coupled to the drain of terminal transistor $Q_1$ and has a capacitor $C_1$ serially disposed between the second terminal of $L_1$ and ground. A second capacitor $C_2$ is disposed between the drain terminal of transistor $Q_1$ and an RF output port RFO. A diode device $CR_1$ is coupled between the drain of transistor $Q_1$ and a node N. A voltage regulation device, shown as a zener diode, $VR_1$ and resistor R are serially coupled between node N and a ground. Similarly, capacitor C is coupled between node N and a ground.

In an unloaded state and in a circuit consisting solely of the capacitors $C_1$ and $C_2$, the inductor $L_1$ and the transistor $Q_1$, current flows through the inductor $L_1$ and transistor $Q_1$ when the transistor $Q_1$ is on. When the transistor $Q_1$ is turned off the voltage across the inductor $L_1$ reverses resulting in a drain to source voltage greater than $2V_{dd}$ causing transistor $Q_1$ to fail. Addition of a zener diode would prevent excessive drain voltage but the capacitance of the zener diode, used alone would make it a poor choice for certain applications such, as an RF amplifier.

The addition of capacitor $C_3$ and RF diode $CR_1$ yields a circuit for protecting against excessive drain voltage that is practical at RF. When the drain voltage exceeds the zener voltage, the RF diode $CR_1$ conducts thereby holding the voltage value of the drain at $V_{zz}$ plus a diode drop. The capacitor $C_3$ is added to insure low impedance at RF when the diode $CR_1$ conducts. If the zener diode is replaced by a resistor and a no-load state exists on the drain, the circuit becomes a boost or step-up voltage converter.

Thus, operationally the apparatus of FIG. 2 receives a signal S that is switched through transistor $Q_1$. The power level of the signal S is gauged in accordance with the above described technique and provides an appropriate output signal to the exciter 10 via the ALC 20 and thereby reduces the value of signal S.

Figure 3:
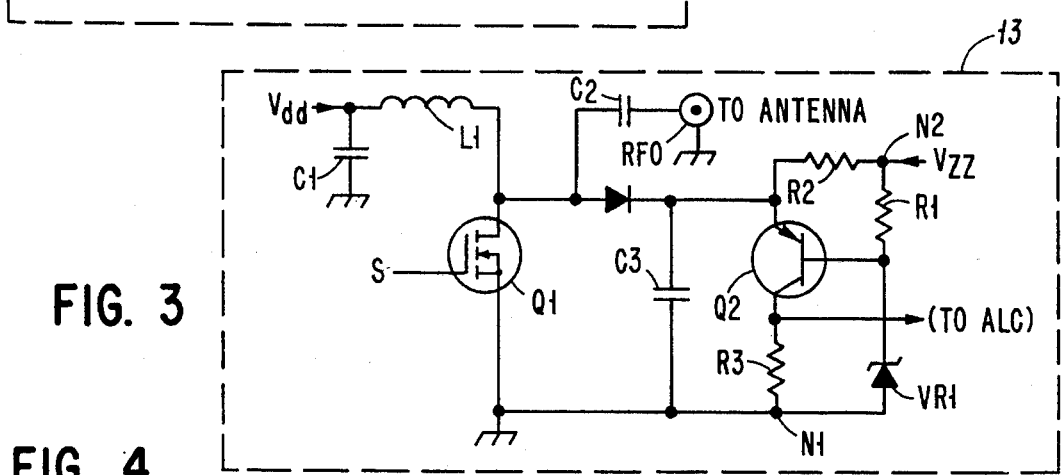
FIG. 3 is a schematic diagram of a dual switched over-voltage protection circuit incorporating the teachings of the present invention.

For those instances requiring greater power parameters the embodiment depicted in FIG. 3 may be utilized. Reference is made to components identified and described in FIG. 2 that remain unchanged and are similarly labeled for purposes of simplicity. A second switching means or power transistor $Q_2$ (shown as a PNP transistor) coupled as an emitter-follower can be used to increase the power handling capability of the circuit. Resistive value $R_2$ is selected to be a high value resistor that is used to maintain the emitter value at the zener voltage when the diode $CR_1$ is not conducting. $R_2$ also provides a sufficient source current to overcome any leakage current to ground. Resistive value $R_3$ is selected to be a small value resistor which provides a means to monitor the current through transistor $Q_2$. The output voltage of $Q_2$ can then be used to decrease the drive signal in a linear amplifier or decrease $V_{dd}$ in a switching amplifier if the power dissipated in transistor $Q_2$ becomes excessive.

Figure 4:
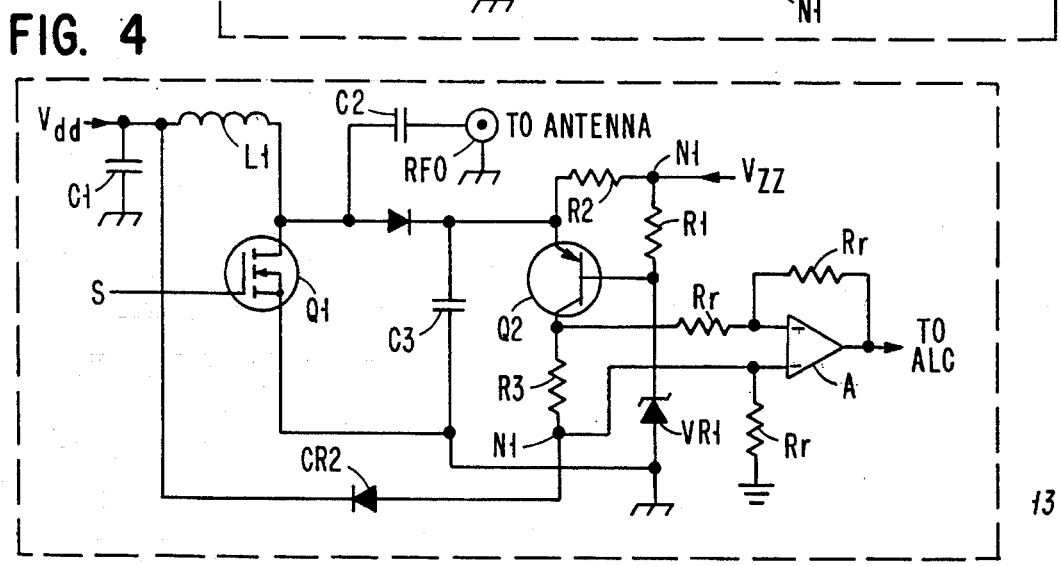
FIG. 4 is a schematic diagram of an alternate embodiment of a dual switched over-voltage protection circuit incorporating the teachings of the present invention.

FIG. 4 illustrates an alternate embodiment of the apparatus of FIG. 3, in which the collector terminal of transistor $Q_2$ is coupled to the drain terminal of transistor $Q_1$ with a resistor $R_3$ and an RF diode $CR_2$ serially disposed between them as shown. A differential amplifier, implemented as resistive means $R_r$ and operational amplifier A are included between the collector terminal of transistor $Q_2$ and the anode terminal of RF diode $CR_2$. An output signal from the operational amplifier A is coupled to ALC means and thereby provides control of the drive signal S when an over-voltage situation is detected. The previously described components of the FIG. 3 apparatus are retained and for simplicity reference is made to the above described relationship as to the coupling and function of such components in the embodiment of FIG. 4. The depicted configuration of FIG. 4 effectively diverts up to one-half of the power of the transistor $Q_2$ back into the power supply.

While particular embodiments of the present invention have been shown and described, it should be clear that changes and modifications may be made to such embodiments without departing from the true scope and spirit of the invention. It is intended that the appended claims to cover all such changes and modifications.

I claim:

1. A method of providing over-voltage protection in an integrated circuit device at variable power levels and microwave frequencies comprising the following steps:

sensing the power level of an applied signal;

determining if the power level exceeds desired operating parameters;

clamping excess voltage in order to provide instantaneous protection to the integrated circuit device from the excess voltage; and generating a control signal to a source driver thereby reducing the value of the applied signal.

* * * * *